(12) United States Patent
Bang et al.

(10) Patent No.: US 6,261,374 B1
(45) Date of Patent: *Jul. 17, 2001

(54) CLOG RESISTANT GAS DELIVERY SYSTEM

(75) Inventors: Won Bang, San Jose; Chen-An Chen, Sunnyvale, both of CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,282

(22) Filed: Sep. 29, 1998

(51) Int. Cl.[7] .............................. C23C 16/00; H05H 1/00
(52) U.S. Cl. .................. 118/726; 118/715; 118/723 VE; 156/345
(58) Field of Search ..................... 118/726, 715, 118/723 VE, 723 MP; 156/345; 137/559.12

(56) References Cited

U.S. PATENT DOCUMENTS

| | | |
|---|---|---|
| 5,186,120 | 2/1993 | Ohnishi et al. ................ 118/726 |
| 5,204,314 | 4/1993 | Kirlin et al. . |
| 5,536,323 | 7/1996 | Kirlin et al. . |
| 5,702,532 | 12/1997 | Wen et al. .................... 118/726 |
| 5,711,816 | 1/1998 | Kirlin et al. . |
| 5,766,360 | 6/1998 | Sato et al. ..................... 118/715 |
| 5,876,503 | 3/1999 | Roeder et al. . |
| 5,925,189 | 7/1999 | Nguyen et al. ................. 118/726 |

*Primary Examiner*—Gregory Mills
*Assistant Examiner*—P. Hassanzadeh
(74) *Attorney, Agent, or Firm*—Dugan & Dugan

(57) ABSTRACT

The present invention recognizes that reactions between processing liquids is a major source of residue which clogs gas delivery systems. To avoid reactions between or among vaporized processing liquids, an inventive gas delivery system provides parallel delivery of vaporized processing liquids. The gas delivery system may be configured using any conventional vaporizing mechanism such as bubblers or injection valves. Preferably, liquid precursors TEPO, TEOS and TEB are vaporized in parallel within three injection valves, the vaporized processing liquids then are flowed into a common line and delivered to a chemical vapor deposition chamber for processing semiconductor wafers. In the unlikely event the line becomes clogged, the line can be easily replaced. Most preferably a single source of carrier gas controlled by a single mass flow controller supplies carrier gas to all three injection valves.

14 Claims, 4 Drawing Sheets

CLOG RESISTANT GAS DELIVERY SYSTEM

FIELD OF THE INVENTION

The present invention relates to gas delivery systems for processing chambers, and specifically to a clog resistant gas delivery system for delivering vaporized liquid precursors; particularly triethylphosphate (TEPO) and tetraethyl orthosilicate (TEOS), to a chemical vapor deposition (CVD) chamber.

BACKGROUND OF THE INVENTION

CVD processing requires a number of vaporized processing liquids. These vaporized liquids are generated and supplied to a CVD chamber via a system of pipes (or "lines") and vaporizing mechanisms known as a gas delivery system. Typically a separate vaporizing mechanism is provided for vaporizing each processing liquid, and is coupled to a source of processing liquid and a source of carrier gas. Each vaporizing mechanism and processing liquid source combination within a gas delivery system is referred to as a vaporization stage. Although a number of vaporizing mechanisms exist (e.g., bubblers, injection valves, etc.), most conventional gas delivery systems employ a plurality of injection valves for vaporizing processing liquids to be delivered to a CVD chamber.

A typical injection valve comprises a processing liquid inlet for receiving a pressurized processing liquid, a carrier gas inlet for receiving a pressurized inert carrier gas, and an outlet for delivering a vaporized processing liquid/carrier gas mixture. The injection valve is heated such that when the processing liquid is injected into the carrier gas, the heat and the low partial vapor pressure of the processing liquid in the carrier gas causes the processing liquid to vaporize. A high carrier gas pressure produces more processing liquid vaporization by lowering the partial vapor pressure of the processing liquid within the carrier gas. Accordingly, when designing a gas delivery system, maintenance of adequate carrier gas pressure is an important consideration, as is minimizing overall system size and complexity.

To achieve a low partial vapor pressure for each processing liquid while minimizing system size, conventional gas delivery systems are configured such that a carrier gas is delivered (via a mass flow controller) to a first injection valve, where it is used to vaporize a first processing liquid, forming a first vaporized processing liquid/carrier gas mixture. The first vaporized processing liquid/carrier gas mixture then is delivered to the carrier gas inlet of a second, consecutive injection valve where it is used to vaporize a second processing liquid. A mixture of the first and second vaporized processing liquids and the carrier gas then is delivered to the carrier gas inlet of a third consecutive injection valve, etc. These configurations provide a compact and cost effective system as they employ a single gas line, and a single carrier gas source controlled by a single mass flow controller to achieve vaporization within each of the various vaporization stages. Additionally, conventional gas delivery systems facilitate processing liquid vaporization as the entire mass flow of carrier gas is applied to each injection valve.

Despite their overall compact and efficient design, maintenance of conventional gas delivery systems is expensive due to injection valve clogging. A clogged injection valve can cause downtime not only of the chamber to which the clogged injection valve is coupled, but also of upstream and/or downstream chambers. In addition to costly chamber downtime, injection valves themselves are expensive, typically costing more than two thousand dollars to replace, exclusive of labor costs. Thus, considerable effort has been devoted to developing clog resistant gas delivery systems, and numerous advances have been achieved.

A particularly worthy advance is the recognition by Applied Materials, Inc., that alloys containing nickel react with the CVD processing liquid TEPO, causing residue formation and clogging, and the recognition that chromium can repress the nickel/TEPO reaction. Thus, gas delivery components made with less than 1% nickel and with 16–27% chromium significantly reduce clogging as described in commonly assigned U.S. Pat. No. 5,925,189 (application Ser. No. 08/568,193, filed Dec. 6, 1995). Despite such advances, clogging within gas delivery systems remains a problem, particularly when a gas delivery system must be configured with existing nickel-containing components.

Accordingly, a need exists for a clog resistant gas delivery system that can be easily and inexpensively repaired, should clogging occur, and that resists clogging regardless of component composition.

SUMMARY OF THE INVENTION

The present invention recognizes that processing liquids and/or contaminants within the various processing liquids react among themselves forming coagulates which clog gas delivery components. Specifically, the present inventors have discovered a reaction between TEOS and $H_3PO_4$ (an impurity frequently found in TEPO, and a by-product of TEPO and nickel reactions) creates a residue responsible for most clogs within TEPO gas delivery systems. As used herein impurities are considered part of the processing liquid. For example, a processing liquid is referred to as comprising $H_3PO_4$ whether $H_3PO_4$ is a constituent of the liquid, or an impurity.

To substantially reduce or eliminate clogging an inventive gas delivery system is provided which routes gas delivery lines in a parallel format such that within each vaporization stage only a single processing liquid is present. The parallel gas delivery lines are joined, and the vaporized processing liquids are mixed within a gas line rather than within an injection valve or bubbler. Because vaporized processing liquids mixing occurs within a gas line, there are no small diameter orifices (such as those contained within injection valves or bubblers) which residue may clog. Further, in the unlikely event of clogging, the gas line can be easily and inexpensively replaced.

In its most preferred embodiment, the inventive gas delivery system comprises a single source of carrier gas and a single mass flow controller for supplying carrier gas to each vaporization stage, thus reducing the number of parts required to vaporize processing liquids in parallel. Generally, however, the present invention may be used to reduce clogging within any processing environment wherein mixed processing constituents form an undesirable reaction product that can clog the various components within a processing constituent delivery system.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
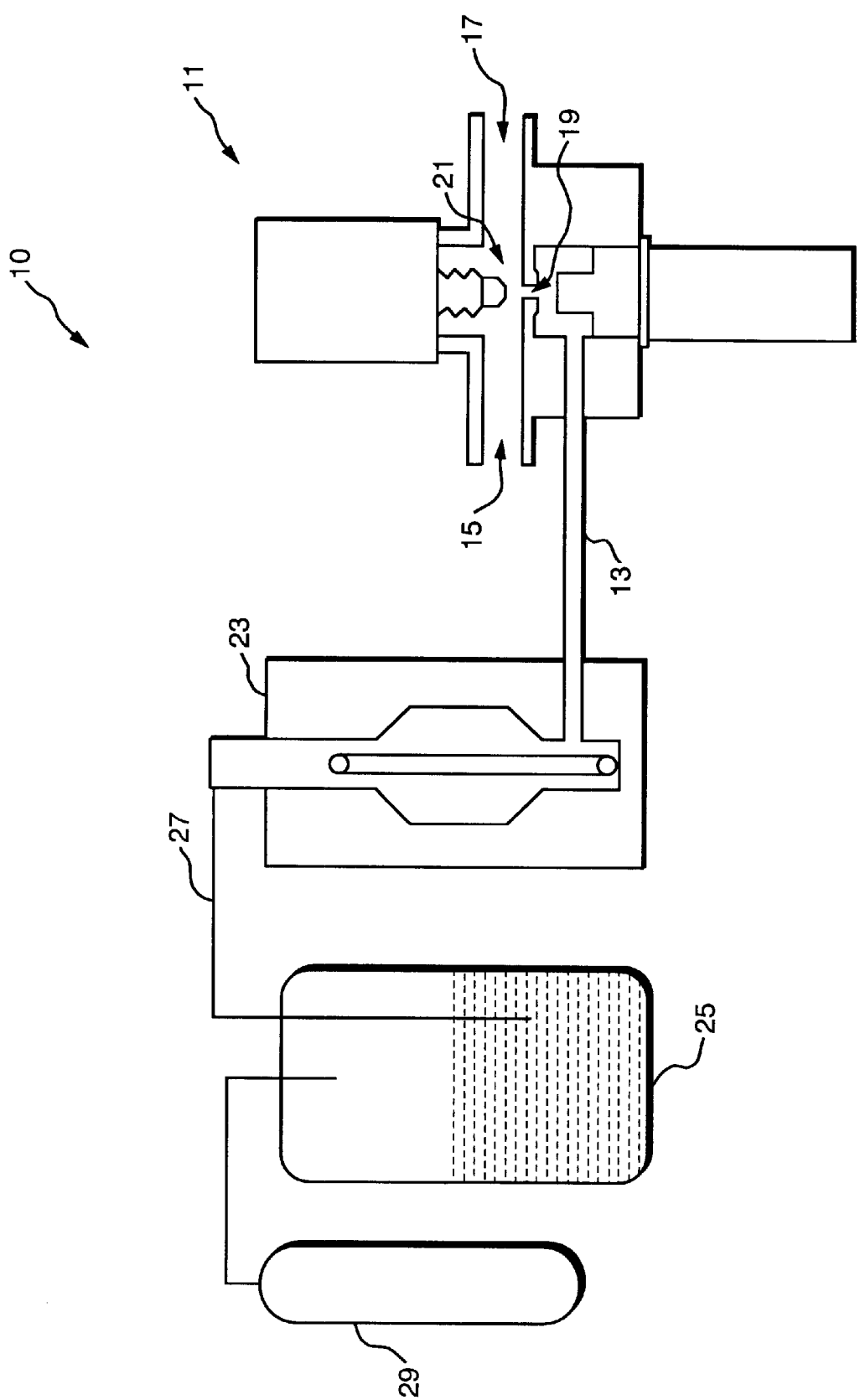
FIG. 1 is a diagrammatic side elevational view of a vaporization stage comprising a conventional injection valve useful in describing the preferred embodiment of the invention.

FIG. 1 is a diagrammatic side elevational view of a vaporization stage 10 comprising a conventional injection valve 11 useful in describing the preferred embodiment of the invention. In pertinent part, the conventional injection valve 11 comprises a processing liquid inlet 13 for inputting a processing liquid, a carrier gas inlet 15 for inputting an inert carrier gas, and an outlet 17 for outputting a vaporized processing liquid/carrier gas mixture. Within the injection valve 11, the processing liquid inlet 13 terminates at an orifice 19 leading to a central region 21 where the processing liquid inlet 13, the carrier gas inlet 15, and the outlet 17 meet. The injection valve 11 is configured such that the relative sizes of the orifice 19 and the central region 21, and the pressures, flow rates and relative direction of the processing liquid and carrier gas flow cause a pressure drop within the central region 21, as is conventionally known in the art. This pressure drop causes processing liquid supplied to the processing liquid inlet 13 to vaporize as it passes from the processing liquid inlet 13, through the orifice 19 to the central region 21. In order to facilitate vaporization, the orifice 19 is small, and thus vulnerable to clogging.

Outside the injection valve 11, the processing liquid inlet 13 is coupled to a liquid flow meter 23 of the vaporization stage 10 which controls the flow rate of processing liquid traveling to the injection valve 11. The liquid flow meter 23 also is coupled via a line 27 to a source of processing liquid 25 within the vaporization stage 10, which in turn is coupled to a source of pressurized helium 29.

In operation, the pressurized helium forces the processing liquid from the processing liquid source 25 through the line 27 to the liquid flow meter 23. The liquid flow meter 23 controls the flow rate of the processing liquid as it travels from the liquid flow meter 23 through the processing liquid inlet 13 and the orifice 19 to the central region 21 of the injection valve 11. A pressurized carrier gas, such as helium, flows through the carrier gas inlet 15 into the central region 21.

The processing liquid vaporizes and mixes with the carrier gas as the processing liquid enters the central region 21, due to the pressure decrease experienced as the processing liquid travels from the orifice 19 to the central region 21. The combined vaporized processing liquid/carrier gas flows from the injection valve 11 via the outlet 17. As described below with reference to FIG. 2, the preferred embodiment of the inventive gas delivery system employs a plurality of conventional injection valves such as the injection valve 11 of FIG. 1.

Figure 2:
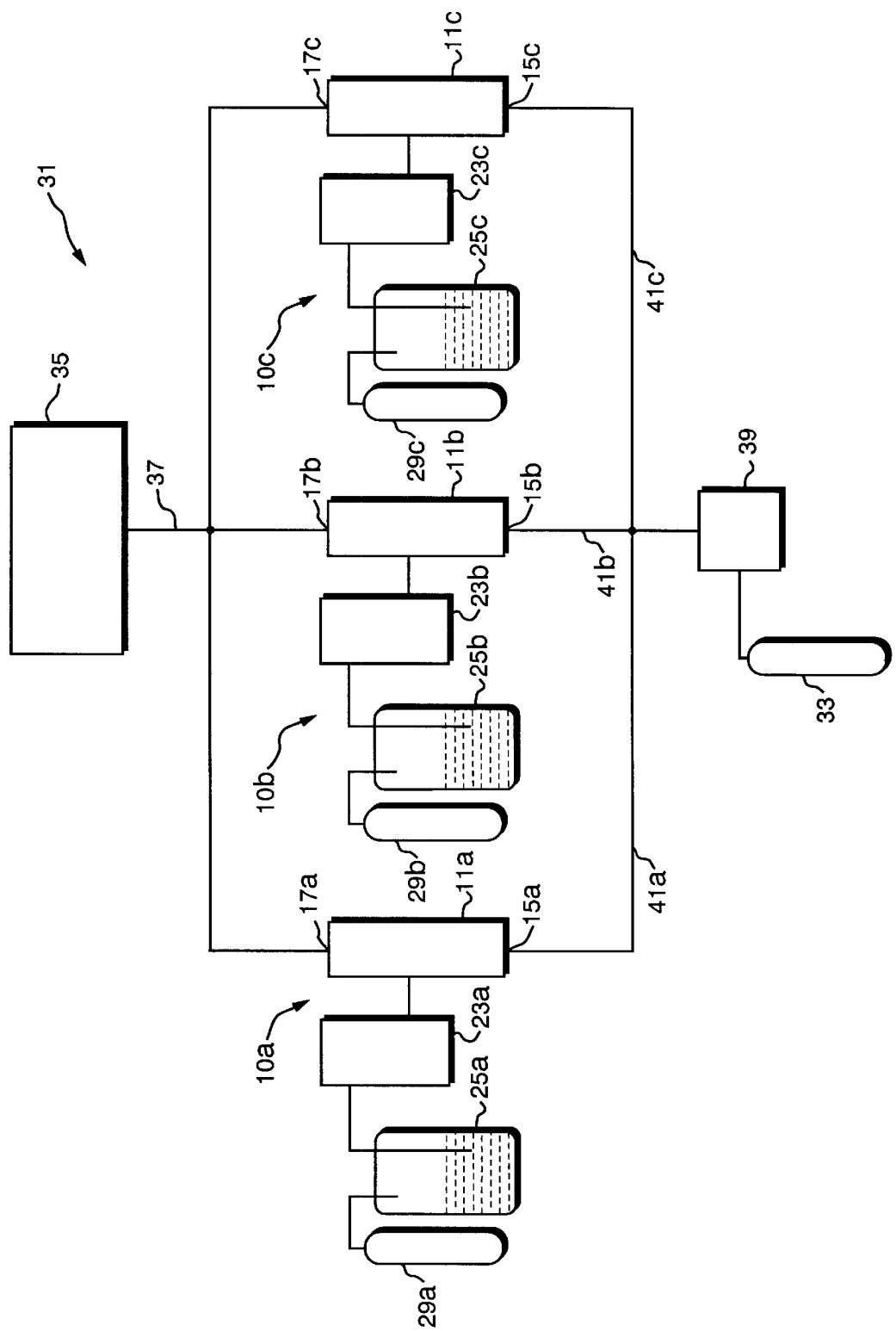
FIG. 2 is a schematic diagram of an inventive gas delivery system, shown coupled to a processing chamber, a processing liquid source and carrier gas source.

FIG. 2 is a schematic diagram of an inventive gas delivery system 31. The gas delivery system 31 is shown coupled between a source of carrier gas, a helium gas source 33, and a processing chamber 35. In the example of FIG. 2, the processing chamber 35 is a CVD chamber configured to deposit silicon dioxide; the silicon dioxide is deposited by flowing TEOS, TEPO and tetraethel borate (TEB) into the processing chamber 35. The gas delivery system 31, therefore, comprises three processing liquid vaporization stages 10a–c. Preferably each vaporization stage comprises an injection valve like the conventional injection valve 11 of FIG. 1, however other vaporization means (e.g., other injection valves, bubblers, etc.) can be employed.

The first stage 10a comprises a first injection valve 11a coupled to a source of liquid TEB 25a via a first liquid flow meter 23a, the second stage 10b comprises a second injection valve 11b coupled to a source of liquid TEOS 25b via a second liquid flow meter 23b, and the third stage 10c comprises a third injection valve 11c coupled to a source of liquid TEPO 25c via a third liquid flow meter 23c. Each source of processing liquid 25a–c is coupled to a source of pressurized helium 29a–c (which may comprise a plurality of sources 29a–c, as shown, or may comprise a single source).

The outlet 17a of the first injection valve 11a, the outlet 17b of the second injection valve 11b, and the outlet 17c of the third injection valve 11c join at a foreline 37. Thus, vaporized TEB, TEOS and TEPO are maintained separately within each stage 10a–c of the gas delivery system 31. Each stage 10a–c of the gas delivery system 31 therefore is free of the processing liquid reactions discovered by the present inventors, and the resultant residue that plagues conventional gas delivery systems. Specifically, $H_3PO_4$, which is both an impurity found in TEPO and a by-product of the reaction between TEPO and nickel (e.g., the nickel found in various stainless steel components of the gas delivery system 31), does not meet and react with TEPO until the $H_3PO_4$ reaches the foreline 37. Residue formed by the TEPO/$H_3PO_4$ reaction does not clog the foreline 37 as the passageway through the foreline 37 does not contain small diameter regions and/or small orifices like those found in processing liquid vaporization means such as bubblers and injection valves. The foreline 37 preferably is configured with a large diameter (preferably at least ¼ inch, and most preferably between ⅜ and ½ inch) to further reduce the possibility of clogging. Nonetheless, because the foreline 37 is a simple pipe, it can be quickly and inexpensively cleaned or replaced should clogging occur.

The preferred gas delivery system of FIG. 2 supplies carrier gas to each vaporization stage via a single carrier gas source 33 controlled by a single mass flow controller 39, and thereby minimizes parts and conserves space. Specifically, after the flow controller 39, the gas delivery system 31 branches in three with a first branch 41a coupling to the carrier gas inlet 15a of the first injection valve 11a, a second branch 41b coupling to the carrier gas inlet 15b of the second injection valve 11b, and a third branch 41c coupling to the carrier gas inlet 15c of the third injection valve 11c. Thus, carrier gas from a single carrier gas source 33 flows to and vaporizes processing liquid within each stage 10a–c of the inventive gas delivery system 31.

In operation, helium, an inert carrier gas, flows from the gas source 33 into the flow controller 39, and the flow controller 39 is set at a first flow rate. As the carrier gas flows into each branch 41a–c the mass flow rate within each branch 41a–c drops to one third of the first flow rate. Alternatively, the branches 41a–c can be configured (e.g., by varying tubing diameter, or by increasing/decreasing the number and degree of bends in each branch, etc.) so that a higher carrier gas flow rate is directed to processing liquids having lower vaporization rates (e.g., TEOS and TEPO).

Within each vaporization stage 10a–c processing liquid is vaporized as described with reference to FIG. 1. Thus, a mixture of vaporized TEB and helium flows from the first injection valve 11a's outlet 17a to the foreline 37, a mixture of vaporized TEOS and helium flows from the second injection valve 11b's outlet 17b to the foreline 37, and a mixture of vaporized TEPO and helium flows from the third injection valve 11c's outlet 17c to the foreline 37. The mixture of TEB, TEOS, TEPO and helium flows through the foreline 37 to the processing chamber 35 where the chamber pressure and temperature causes the TEB, TEOS and TEPO to react forming a silicon dioxide layer on a substrate (not shown) positioned within the processing chamber 35. Because the foreline 37 has no small diameter orifices (i.e., is unrestricted) any residue formed by the mixture of TEB, TEOS and TEPO will not clog the foreline 37.

Figure 3:
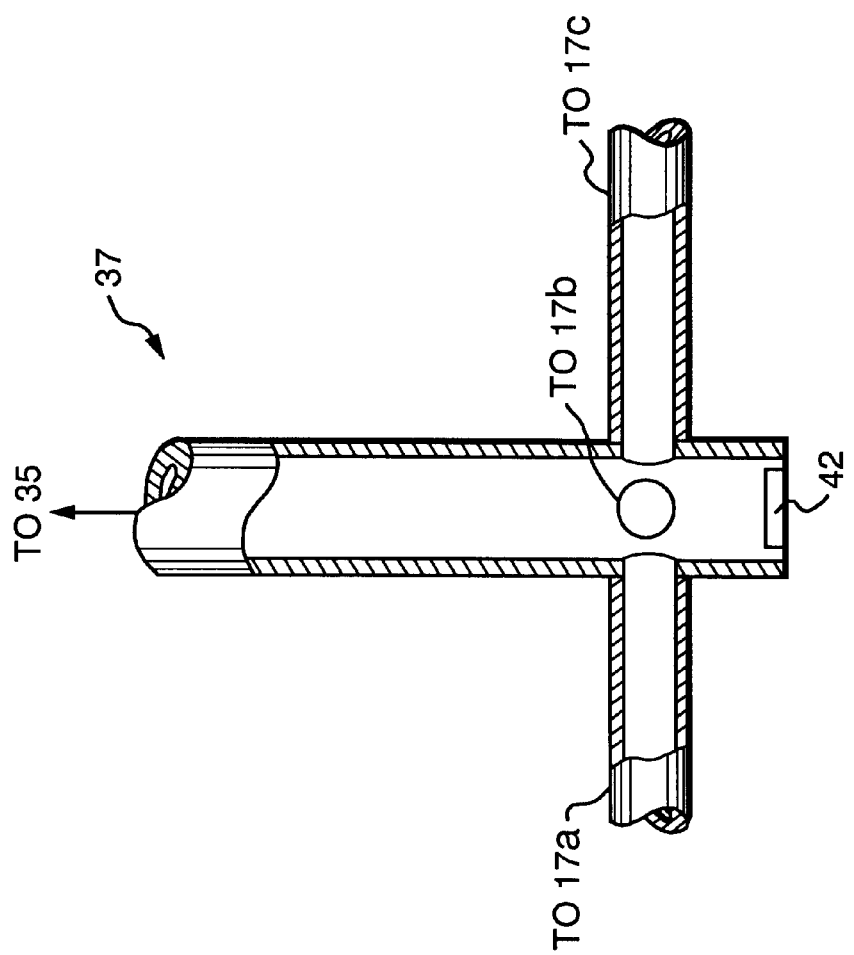
FIG. 3 is a side elevational view of a foreline of the inventive gas delivery system of FIG. 2.

FIG. 3 is a side elevational view of the foreline 37 of the inventive gas delivery system of FIG. 2. The present inventors believe that the inventive gas distribution system achieves more uniform concentrations of vaporized processing liquids, and superior mixing among the vaporized processing liquids and the carrier gas, because the vaporized processing liquids intermingle for the first time within a larger diameter region (e.g., within the ½ inch foreline 37 rather than within the ¼ inch lines directly coupled to each injection valve output 17a–c). To increase turbulence and mixing within the foreline 37, the vaporized processing liquids preferably are introduced to the foreline 37 in a spaced relationship as shown in FIG. 3. The configuration of FIG. 3, with the injection valve outlets 17a–c entering the foreline 37 from the sides thereof, is preferred as an inline liquid monitor 42 can be coupled below the outlets 17a–c. In this manner any residue which forms drops onto the inline liquid monitor 42 allowing the inline liquid monitor 42 to detect when the foreline 37 should be cleaned or replaced. Inline liquid monitors are well known in the art. Accordingly, a suitable inline monitor will be readily apparent to those of ordinary skill in the art. Although the outlets 17a–c are shown coupling the foreline 37 at the same level, they may alternatively couple the foreline 37 at varied levels.

Figure 4:
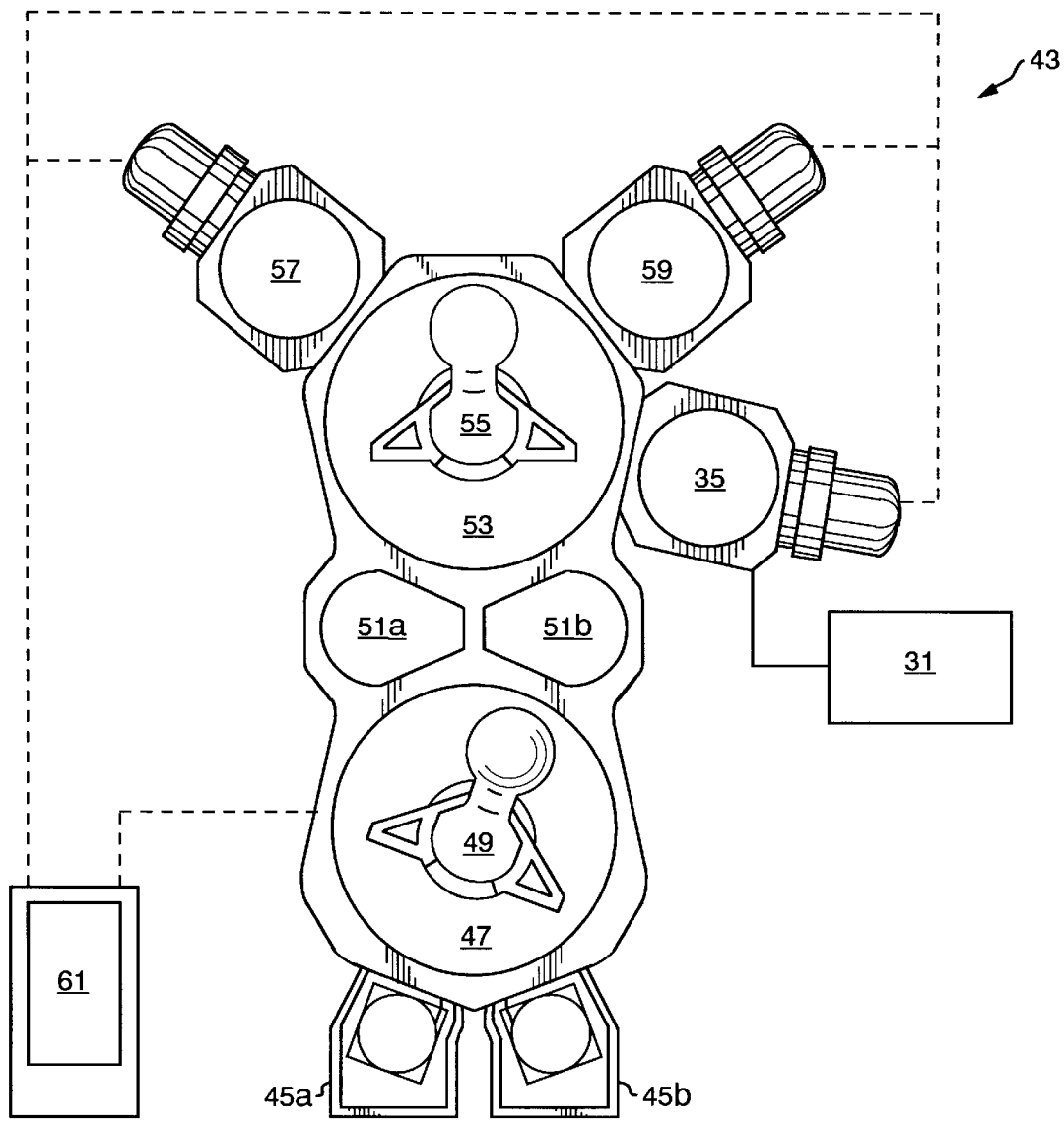
FIG. 4 is a top plan view of an automated tool for semiconductor device fabrication which employs the inventive gas delivery system of FIG. 2.

FIG. 4 is a top plan view of an automated tool 43 for fabricating semiconductor devices. The tool 43 comprises a pair of load locks 45a, 45b, and a first wafer handler chamber 47 containing a first wafer handler 49. The first wafer handler chamber 47 is operatively coupled to the pair of load locks 45a, 45b and to a pair of pass-through chambers 51a, 51b. The pair of pass-through chambers 51a, 51b are further coupled to a second wafer handler chamber 53 (e.g., a transfer chamber), containing a second wafer handler 55, and to a plurality of processing chambers 57, 59. Most importantly, the second wafer handler chamber 53 is coupled to the processing chamber 35 of FIG. 2 which is further coupled to the inventive gas delivery system 31. The entire tool 43 is controlled by a controller 61 (which comprises a microprocessor and a memory—not shown) having a program therein, which controls semiconductor wafer transfer among the load locks 45a, 45b, the pass-through chambers 51a, 51b, and the processing chambers 57, 59, 35, and which controls processing therein.

The controller program and the overall configuration of the tool 43 is designed for optimal productivity. A clogged gas delivery system within such a tool is particularly costly, as it can affect the productivity of the entire tool 43, including the plurality of processing chambers contained therein. Thus, by employing the inventive gas delivery system 31, the value of the automated semiconductor processing tool 43 increases significantly.

The foregoing description discloses only the preferred embodiments of the invention, modifications of the above disclosed apparatus and method which fall within the scope of the invention will be readily apparent to those of ordinary skill in the art. For instance, the inventive gas delivery system can be advantageously employed to reduce clogging due to any number of processing liquids. The invention is neither limited to the delivery of merely three processing liquids nor to the delivery of the specific processing liquids described, nor is the invention limited to liquid sources. That is, the present invention may be used to reduce clogging within any processing environment wherein mixed processing constituents form an undesirable reaction product that can clog the various components within a processing constituent delivery system. Further, it will be understood that the exemplary gas delivery system of FIG. 2 may contain additional components (e.g., valves, flow meters, etc.), and the various components of the gas delivery system can be made with reduced nickel content and increased chromium content to further reduce residue formation. Finally, although the benefits of the inventive gas delivery system are most dramatic when used with injection valves, other vaporization mechanisms (e.g., bubblers, etc.) may be employed.

Accordingly, while the present invention has been disclosed in connection with the preferred embodiments thereof, it should be understood that other embodiments may fall within the spirit and scope of the invention, as defined by the following claims.

The invention claimed is:

1. A gas delivery system comprising:
   a plurality of injection valves, each injection valve having a carrier gas inlet, an outlet and a processing liquid inlet, the processing liquid inlet having an orifice configured to facilitate vaporization of a processing liquid passing therethrough via a pressure drop; and
   a first line having a plurality of inlets, each line inlet operatively coupling one of the injection valves' outlets.

2. The gas delivery system of claim 1 further comprising:
   a single carrier gas source operatively coupled to the carrier gas inlet of each of the plurality of injection valves.

3. The gas delivery system of claim 2 further comprising:
   a first processing liquid source containing a first processing liquid, the first processing liquid source being operatively coupled to a processing liquid inlet of a first one of the injection valves; and
   a second processing liquid source containing a second processing liquid that reacts to form a residue when mixed with the first processing liquid, the second processing liquid source being operatively coupled to a processing liquid inlet of a second one of the injection valves.

4. The gas delivery system of claim 3 wherein the first processing liquid comprises $H_3PO_4$ and the second processing liquid comprises TEOS.

5. The gas delivery system of claim 1 further comprising:
   a first processing liquid source containing a first processing liquid, the first processing liquid source being operatively coupled to a processing liquid inlet of a first one of the injection valves; and
   a second processing liquid source containing a second processing liquid that reacts to form a residue when mixed with the first processing liquid, the second processing liquid source being operatively coupled to a processing liquid inlet of a second one of the injection valves.

6. The gas delivery system of claim 5 wherein the first processing liquid comprises $H_3PO_4$ and the second processing liquid comprises TEOS.

7. A processing system comprising:

the gas delivery system of claim 1 wherein the first line further comprises an outlet; and a processing chamber operatively coupled to the outlet of the first line.

8. The processing system of claim 7 further comprising:

a single carrier gas source operatively coupled to the carrier gas inlet of each of the plurality of injection valves.

9. The processing system of claim 8 further comprising:

a first processing liquid source containing a first processing liquid, the first processing liquid source being operatively coupled to a processing liquid inlet of a first one of the injection valves; and a second processing liquid source containing a second processing liquid that reacts to form a residue when mixed with the first processing liquid, the second processing liquid source being operatively coupled to a processing liquid inlet of a second one of the injection valves.

10. The processing system of claim 9 wherein the first processing liquid comprises $H_3PO_4$ and the second processing liquid comprises TEOS.

11. A processing system for chemical vapor deposition of silicon dioxide, comprising:

the processing system of claim 10; and a third processing liquid source containing a third processing liquid, the third processing liquid source being operatively coupled to a processing liquid inlet of a third one of the injection valves;

wherein the third processing liquid comprises TEB and the first processing liquid further comprises TEPO.

12. The processing system of claim 7 further comprising:

a first processing liquid source containing a first processing liquid, the first processing liquid source being operatively coupled to a processing liquid inlet of a first one of the injection valves; and a second processing liquid source containing a second processing liquid that reacts to form a residue when mixed with the first processing liquid, the second processing liquid source being operatively coupled to a processing liquid inlet of a second one of the injection valves.

13. The processing system of claim 12 wherein the first processing liquid comprises $H_3PO_4$ and the second processing liquid comprises TEOS.

14. An automated semiconductor device processing system comprising:

a load lock;

a transfer chamber operatively coupled to the load lock;

a wafer handler within the transfer chamber; and the processing system of claim 7, operatively coupled to the transfer chamber and to the wafer handler.

* * * * *